US006544870B2

(12) United States Patent
Park et al.

(10) Patent No.: US 6,544,870 B2
(45) Date of Patent: Apr. 8, 2003

(54) SILICON NITRIDE FILM COMPRISING AMORPHOUS SILICON QUANTUM DOTS EMBEDDED THEREIN, ITS FABRICATION METHOD AND LIGHT-EMITTING DEVICE USING THE SAME

(75) Inventors: Nae Man Park, Kwangju (KR); Tae Soo Kim, Kwangju (KR); Seong Ju Park, Kwangju (KR)

(73) Assignee: Kwangju Institute of Science and Technology, Kwangju (KR)

( * ) Notice: Subject to any disclaimer, the term of this patent is extended or adjusted under 35 U.S.C. 154(b) by 0 days.

(21) Appl. No.: 09/836,175

(22) Filed: Apr. 18, 2001

(65) Prior Publication Data

US 2002/0153522 A1 Oct. 24, 2002

(51) Int. Cl.$^7$ ............................................. H01L 21/36
(52) U.S. Cl. ....................................... 438/507; 438/503
(58) Field of Search ............................................. 257/14

(56) References Cited

U.S. PATENT DOCUMENTS

| | | | | |
|---|---|---|---|---|
| 6,103,600 A | * | 8/2000 | Ueda et al. .................. | 257/213 |
| 6,130,143 A | * | 10/2000 | Westwater et al. .......... | 438/478 |
| 6,194,736 B1 | * | 2/2001 | Chaloux et al. ............. | 257/30 |
| 6,235,618 B1 | * | 5/2001 | Jeong-Sook et al. ......... | 117/97 |

OTHER PUBLICATIONS

Kim et al, Room temperature single–electron effects in Si quantum dot memory with oxide–nitride tunneling dielectrics, IEDM 09/98 pp. 111–114.*

Chen, Visible photoluminescence in crystallized amorphous Si:H/SiNx:H multiquantum–well structures, Applied Physics Letters, 61 (17), Oct. 26, 1992, pp2069–2071.*
Wolf, Silicon Processing for the VLSI Era, vol. 1.*
Mingxiang Wang, Xinfan Huang, Jun Xu, Wei Li, Zhiguo Liu, and Kunji Chen, "Observation of the size–dependent blueshifted electroluminescence from nanocrystalline Si fabricated by KrF excimer laser annealing of hydrogenated amorphous silicon/amorphous–SiN$_x$:H superlattices," Applied Physics Letters, vol. 72, No. 6, Feb. 9, 1998, pp. 722–724.
V. A. Volodin, M.D. Efremov, V.A. Gritsenko, and S. A. Kochbei, "Ramon study of silicon nanocrystals formed in SiN$_x$ films by excimer laser or thermal annealing," Applied Physics Letters, vol. 73, No. 9, Aug. 31, 1998, p. 1212–1214.
Z. H. Lu, D. J. Lockwood and J. M. Baribeau, "Quantum confinement and light emission in SiO$_2$/Si superiattices," Nature, vol. 378, Nov. 16, 1995, pp. 258–260.
Ching–Song Yangg, Chrong–Jung Lin, Ping–Yu Kuei, Sheng Fu Horng, Charles Ching–Hsiang Hsu and Ming–Chi Liaw," Quantum size effects on photoluminescence from Si nanocrystals in PECVD silicon–rich–oxide," Applied Surface Science, vol. 113/114 (1997), pp. 116–120.

* cited by examiner

Primary Examiner—Tom Thomas
Assistant Examiner—Samuel A Gebremariam
(74) Attorney, Agent, or Firm—Foley & Lardner

(57) ABSTRACT

The present invention relates to a light-emitting device utilizing amorphous silicon quantum dot nanostructures, wherein the light-emitting device can be fabricated using the existing silicon semiconductor fabrication technology, is excellent in light-emitting efficiency, and can emit light in the visible region including short wavelength region such as green and blue.

7 Claims, 3 Drawing Sheets

SILICON NITRIDE FILM COMPRISING AMORPHOUS SILICON QUANTUM DOTS EMBEDDED THEREIN, ITS FABRICATION METHOD AND LIGHT-EMITTING DEVICE USING THE SAME

BACKGROUND OF THE INVENTION

1. Field of the Invention

The present invention relates to a silicon nitride film containing amorphous silicon quantum dot (QD) nanostructures, its fabrication method, and a light-emitting device using the silicon nitride film. A silicon light-emitting device adapting the silicon nitride film in accordance with the present invention can be produced using the existing silicon semiconductor fabrication technology, is excellent in light-emitting efficiency, and can emit light in the visible region including short wavelength region such as green and blue.

2. Description of the Prior Art

To obtain light emission using silicon, one of indirect band gap semiconductors, quantum confinement effect has to be created by a nanostructure. To obtain this quantum confinement effect, crystalline or amorphous silicon nanostructures that are less than 5 nm such as quantum well, quantum wire, and quantum dot have to be produced using materials with larger energy gap than that of a bulk silicon as a matrix or a barrier. Here, the wavelength of the light moves to shorter wavelength as the size of the nanostructure gets smaller. Among these nanostructures, quantum dot structure has an advantage of high quantum efficiency.

In the previous silicon nanostructures, silicon oxide has been widely used as a matrix or a barrier. However, it has disadvantages of a difficulty in transport of carrier such as an electron or a hole since tunneling barrier is too high, which is 3.15 eV for an electron and 3.8 eV for a hole. [reference. V. A. Volodin, M. D. Efremov, V. A. Gritsenko and S. A. Kochubei. Appl. Phys. Lett., 73, 1212, 1998]. Therefore, in case of fabricating a light-emitting device using the silicon oxide, the thickness of a matrix or a barrier needs to be formed as thinly as possible for low operating voltage. Moreover, a very small nanostructure has to be formed to obtain the light emission in a visible region (1.77 to 3.1 eV) since energy gap of bulk crystalline silicon is approximately 1.1 eV. This makes the development of an efficient device difficult since there is a limit in controlling the nanostructure and the thickness of a matrix or a barrier.

Recently, to overcome these limitations, a method using silicon nitride that has lower tunneling barrier (2.0 eV for an electron and 1.5 eV for a hole. Refer to the literature above by Volodin) than silicon oxide as a matrix or a method to form a nanostructure using amorphous silicon has been suggested.

For example, Wang et al. published the light emission characteristics of the device when silicon nitride is used as a matrix. [Reference. M. Wang, X. Huang, J. Xu, W. Li, Z. Liu, and K. Chen, Appl. Phys. Lett. 72, 722, 1998] The structure described in the literature above is a crystalline quantum dot structure which is contained in a quantum well and this crystalline quantum dot structure is usually fabricated through laser annealing after the quantum well structure is grown. Therefore, the procedure is complex and obtaining light emission at high energy is difficult since it is a crystalline structure. Meanwhile, Lu et al. reported an obtaining of a light emission from amorphous silicon quantum well structure using silicon oxide as a barrier. [reference. Z. H. Lu, D. J. Lockwood, and J. M. Baribeau, Nature, 378, 258, 1995].

However, a superior method of forming a silicon nanostructure has been in need since all of the methods described above have limitations in increasing the efficiency of light emission as well as in decreasing output wavelength.

SUMMARY OF THE INVENTION

Therefore, it is an object of the present invention to form an amorphous silicon nanostructure that enhances the light emission efficiency when applied to silicon light-emitting device and to form an amorphous silicon nanostructure that enables the light emission at shorter wavelength.

It is the object of the present invention to provide a silicon nitride matrix and amorphous silicon quantum dot nanostructures embedded in the silicon nitride matrix.

It is another object of the present invention to provide a fabrication method of a silicon nitride thin film on a substrate by supplying silicon source gas and nitrogen source gas into the thin film growth system in a flow ratio of 1:1000 to 1:2000.

It is still another object of the present invention to provide a silicon light-emitting device that includes the silicon nitride thin film described above.

In the present invention, a term "amorphous silicon quantum dot nanostructure" means a quantum dot structure where a silicon nitride thin film is a matrix and fine amorphous silicon dots each having the size of a several nanometers are dispersed into it. In this invention, the form of amorphous silicon is normally spherical but is not limited to this. The size is approximately 1.0 to 4.0 nm and it exists in a concentration of $1.0 \times 10^{19}$ to $1.0 \times 10^{21}/cm^3$. In this invention, the thickness of a silicon nitride thin film that contains amorphous silicon quantum dot nanostructures is generally 3 to 100 nm, although this varies with the types of device it is applied and the degree of light emission desired.

To form the silicon nitride thin film of the present invention, silicon nitride matrix is grown and amorphous silicon needs to be formed properly within the matrix at the same time.

In the present invention, the term "thin film growth system" is a generally used term for thin film growth method in this field. For example, it designates CVD (Chemical Vapor Deposition), MBE(Molecular Beam Epitaxy), and Ion Implantation. Especially, PECVD(Plasma Enhanced Chemical Vapor Deposition) that are commonly used in fabricating silicon device can be effectively used in this invention.

In the formation of silicon nitride thin film, silane gas is normally used as a silicon source gas and nitrogen atom containing gas such as nitrogen gas or ammonia are normally used as a nitrogen source. Flow ratio of silicon source gas and nitrogen source gas is 1:1000 to 1:2000 during the formation of silicon nitride thin film.

In the present invention, points to be considered in embedding amorphous silicon quantum dot nanostructures into silicon nitride matrix are as follows.

In first, growth rate of the thin film needs to be slow down to form a silicon nitride thin film that contains amorphous silicon quantum dot nanostructures. If the growth rate is too fast, light emission cannot be obtained since nanostructures are not formed and the thin film itself becomes pure amorphous silicon nitride. In order to slow down the growth rate, silicon source gas should be introduced into a reactor with a relatively low flow rate of 1 to 100 sccm when silicon source gas is diluted in 1 to 10% with an inert gas such as nitrogen or argon. Nitrogen source gas needs to be introduced at the flow rate of more than 500 sccm. Growth temperature is kept at between 100 to 300° C. Also, the growth rate of silicon nitride thin film should be controlled at 1.4 to 3.2 nm/min by keeping the plasma power at lower than 6 W thereby lowering the concentration of the reacting radicals produced by plasma.

In second, an amorphous silicon quantum dot nanostructure is hard to be obtained if ammonia gas is used as a nitrogen source. The reason is that ammonia gas is easily dissociated to reacting radicals compared to nitrogen gas resulting in a increased growth rate, therefore, the slow growth rate that is inevitable for the formation of amorphous silicon quantum dot nanostructure should be achieved by diluting the nitrogen gas.

In third, oxygen gas or oxide should not be introduced when amorphous silicon quantum dot nanostructure is formed. If this happens, oxygen related defects or compounds can either emit unwanted lights or become obstacles to light emission. Therefore, introduction of any oxide should be suppressed to obtain desired light emission.

According to the present invention, a silicon light-emitting device including a silicon nitride thin film where amorphous silicon quantum dot nanostructure is embedded is also provided. The silicon light-emitting device has a junction structure such as p-type semiconductor/insulator/n-type semiconductor(PIN), metal/insulator/semiconductor (MIS), and conductive polymer/insulator/semiconductor. The insulator means a silicon nitride thin film where an amorphous silicon quantum dot nanostructure is embedded. Here, the light-emitting wavelength can be properly controlled since it moves to a short wavelength as the flow rate of nitrogen is increased during the silicon nitride formation step.

DESCRIPTION OF THE PREFERRED EMBODIMENT

The preferred embodiment of the present invention will be described hereinafter with reference to the attached drawings.

[Embodiment 1: Formation of Amorphous Silicon Quantum Dot Nanostructure]

Using 5% silane gas diluted in nitrogen gas and nitrogen gas with the purity of 99.9999%, a silicon thin film is obtained through the growth of amorphous silicon quantum dot nanostructures that are dispersed into the silicon nitride matrix on a n-type(100) silicon substrate utilizing PECVD.

The flow rate of the silane gas, growth pressure, and plasma power are kept at 10 sccm, 0.5 torr, and 6 W, respectively. Samples are deposited at growth temperature varied from 100 to 300° C. and the flow rate of nitrogen gas from 500 sccm to 800 sccm. Growth rate was controlled at from 1.4 to 3.2 nm/min depending on the flow rate of nitrogen gas.

Figure 1:
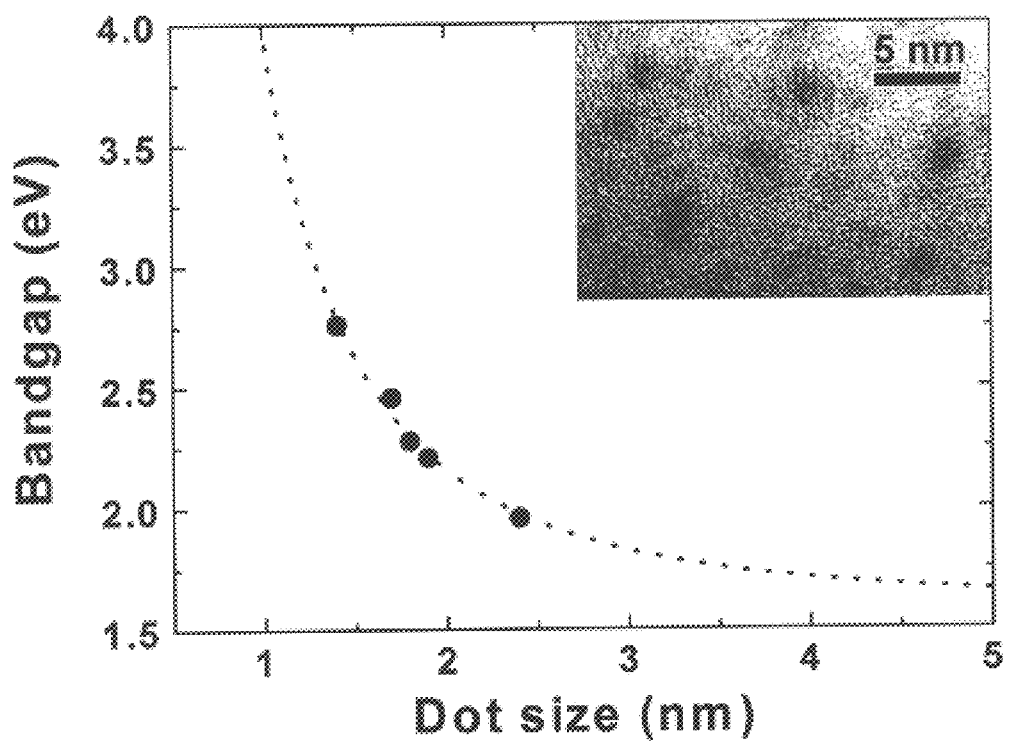
FIG. 1 is photoluminescence peak energy of a-Si (amorphous silicon) QDs as a function of the dot size, where the dashed line was obtained from the effective mass theory for three-dimensionally confined Si dots and the inset shows a cross sectional high-resolution transmission electron micrograph of a-Si QDs with an average size of 1.9 nm.

Amorphous silicon nanostructure formed by the method described above can emit light efficiently without post-treatment process such as thermal annealing. The change in the photoluminescence peak energies with the QD sizes is shown in FIG. 1. This figure clearly shows the blue shift of photoluminescence peak with decreasing the dot size. The inset shows a cross sectional high-resolution transmission electron micrograph of a-Si QDs with an average size d=1.9 nm. The well-organized a-Si QDs appear as dark spots in the high-resolution transmission electron microscopic image because the a-Si QD has a higher atomic density than the silicon nitride matrix material.

Figure 2:
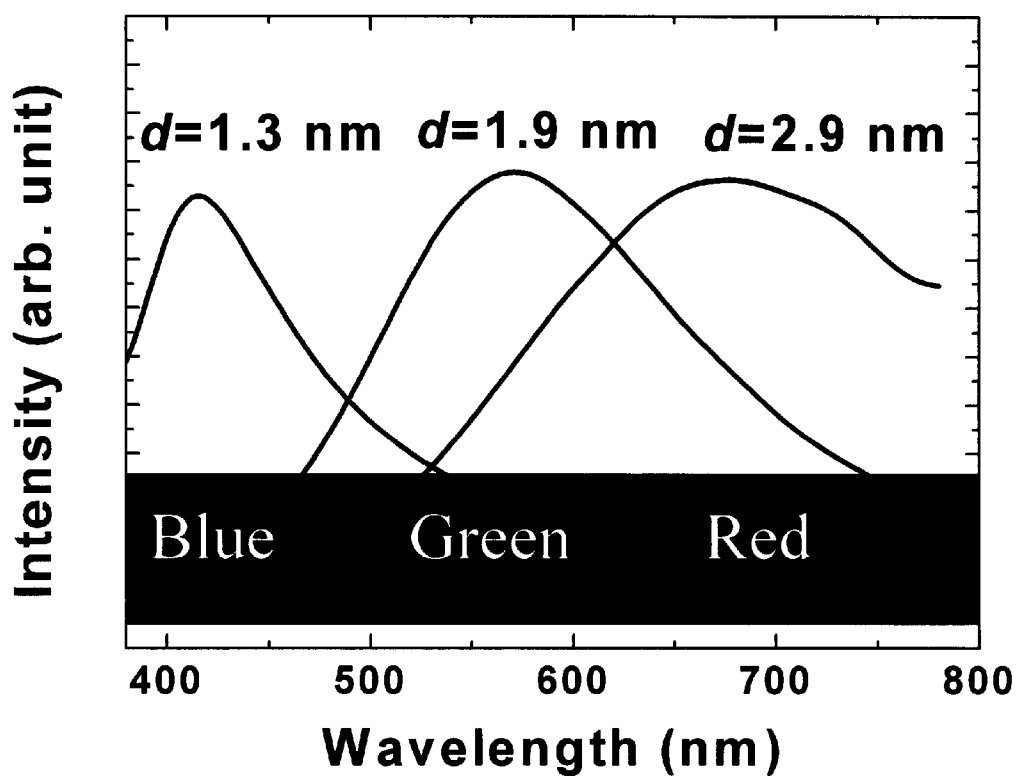
FIG. 2 shows Red, green, blue PL spectra and photographs of samples during PL measurements.

FIG. 2 shows the red, green, blue PL spectra and photographs of a-Si QD samples corresponding to each photoluminescence spectrum. As shown in FIG. 1, the emission color could be changed by controlling the dot size. For example, the dot sizes corresponding to red, green, and blue emission color were 2.9, 1.9, 1.3 nm, respectively. The dot size could be controlled by changing the additional flow rate of nitrogen gas. The increase in nitrogen gas flow rate is believed to enhance the formation of small a-Si clusters because the increase in nitrogen gas flow rate facilitates the creation of nucleation sites and the formation of small a-Si clusters when the flow rate of silane gas was maintained at a constant level.

Figure 3:
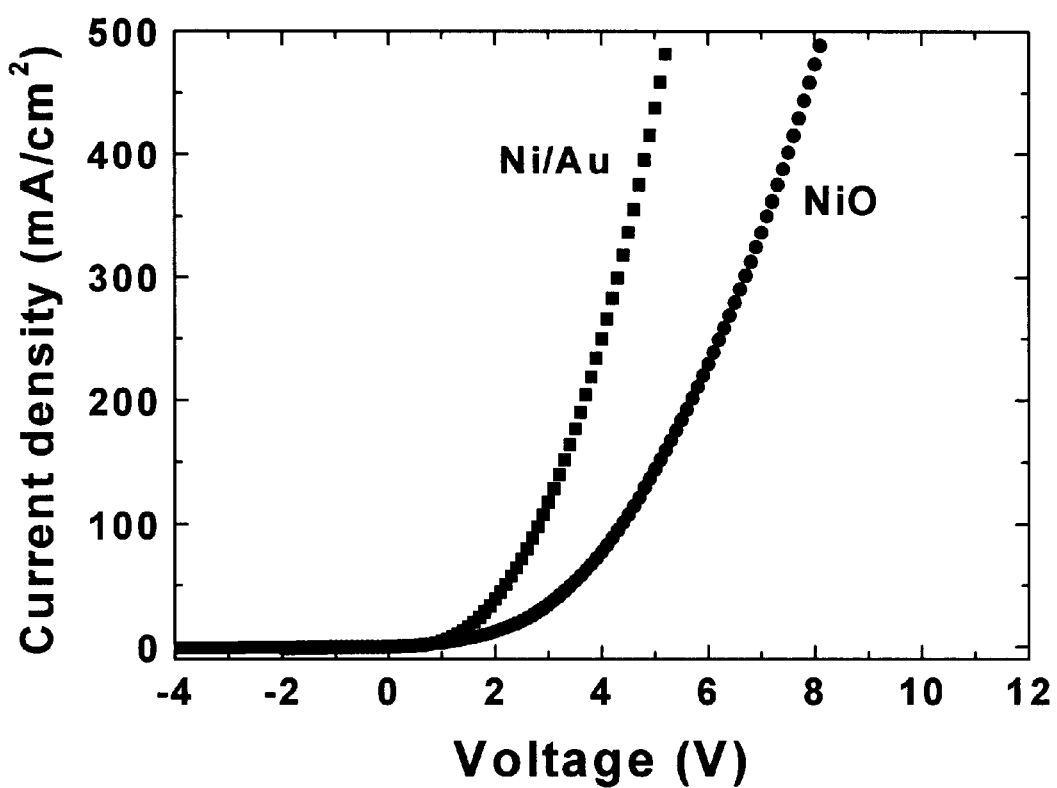
FIG. 3 shows current-voltage (I–V) curves of light-emitting device having Ni/Au and NiO top electrodes.

FIG. 3 shows typical current-voltage (I–v) curves of light-emitting device having Ni/Au and NiO top contact layers. The turn-on voltage was less than 5 V. The series resistance estimated by I–V curve was about 80 $\Omega$ for NiO contact layer and 21 $\Omega$ for as-deposited Ni/Au contact layer. Although the resistance of NiO was higher than that of as-deposited Ni/Au metal, the optical transmittance of NiO was very high. In this experiment, the transmittance of NiO was measured to be about 50~80% in the visible spectrum range. This device emitted an orange color light through the NiO top. This sample also showed an orange-like color emission in PL spectrum.

COMPARATIVE EXAMPLE 1

In case of a crystalline silicon quantum dot nanostructure formed in silicon oxide matrix utilizing PECVD according to the method of Yang et al. [C. S. Yang, C. J. Lin, P. Y. Kuei, S. F. Horng, C. C. H. Hsu, and M. C. Liaw, Appl. Surf. Sci. 113/114, 116, 1997], highly efficient light emission was difficult to be achieved even with the thermal treatment for 30 minutes at 450° C. and for 2 hours at 1000° C. under nitrogen ambient and it showed light emission in the red region of 620 to 750 nm.

A silicon nitride thin film including amorphous silicon quantum dot nanostructures disclosed in the present invention utilizes silicon nitride as a matrix instead of silicon oxide since silicon nitride facilitates the transport of a carrier due to lower tunneling barrier therefore enhances the possibility of its application as light-emitting devices. Also nanostructures are formed amorphous instead of crystalline so that light emission in short wavelength can be obtained more easily and selective light emission in a desired wavelength can be achieved by controlling the flow rate of nitrogen gas.

Although the present invention has been illustrated with reference to embodiments of the present invention, various modifications are possible within the scope of the present invention. Therefore, the scope of the present invention should be defined not by the illustrated embodiments but by the attached claims.

What is claimed is:

1. Method of fabricating a silicon nitride thin film comprising a silicon nitride matrix and amorphous silicon quantum dot nanostructures embedded in the silicon nitride matrix, the method comprising the steps of:

placing a substrate within a thin film growth system; and supplying silicon source gas and nitrogen source gas into the thin film growth system in a flow ratio of 1:100 to 1:5000 while maintaining the substrate at a temperature of 100 to 700° C. in order to form the silicon nitride film on the substrate with a growth rate of 1.4 to 10 nm/min, where the amorphous silicon quantum dot nanostructures of the silicon nitride film formed can emit photoluminescent light.

2. The method of claim 1, wherein the thin film formation step is performed at a pressure of 0.01 to 10 torr.

3. The method of claim 1, wherein the thin film growth system utilizes a thin film forming process selected from the group consisting of CVD, MBE, ion implantation and PECVD.

4. The method of claim 1, wherein the silicon source gas is diluted in 1 to 10% with an inert gas.

5. A method of fabricating a silicon nitride thin film comprising a silicon nitride matrix and amorphous silicon quantum dot nanostructures embedded in the silicon nitride matrix, the method comprising:

forming the silicon nitride film on a substrate, wherein the amorphous silicon quantum dot nanostructures of the silicon nitride film formed can emit photoluminescent light.

6. The method of fabricating a silicon nitride thin film of claim 5, wherein the forming further comprises supplying silicon source gas and nitrogen source gas to form the silicon nitride film.

7. A method of fabricating a silicon nitride thin film comprising a silicon nitride matrix and amorphous silicon quantum dot nanostructures embedded in the silicon nitride matrix, the method comprising the steps of:

placing a substrate within a thin film growth system; and supplying silicon source gas and nitrogen source gas into the thin film growth system in a flow ratio of 1:100 to 1:2000 while maintaining the substrate at a temperature of 100 to 300° C. in order to form the silicon nitride film on the substrate with a growth rate of 1.4 to 3.2 nm/min, wherein the amorphous silicon quantum dot nanostructures of the silicon nitride film formed can emit photoluminescent light.

* * * * *